(12) United States Patent  (10) Patent No.: US 7,916,204 B2
Wells et al.  (45) Date of Patent: Mar. 29, 2011

(54) MULTIPLE MICROLENS SYSTEM FOR IMAGE SENSORS OR DISPLAY

(75) Inventors: David Wells, Boise, ID (US); Ulrich C. Boettiger, Boise, ID (US)

(73) Assignee: Micron Technology, Inc., Bosie, ID (US)

( * ) Notice: Subject to any disclaimer, the term of this patent is extended or adjusted under 35 U.S.C. 154(b) by 0 days.

(21) Appl. No.: 12/628,709

(22) Filed: Dec. 1, 2009

(65) Prior Publication Data

US 2010/0073540 A1    Mar. 25, 2010

Related U.S. Application Data

(63) Continuation of application No. 10/431,379, filed on May 8, 2003, now abandoned.

(51) Int. Cl.
*H04N 5/225* (2006.01)
(52) U.S. Cl. ..................... 348/340; 250/201.1
(58) Field of Classification Search ............ 359/620, 359/621, 628, 629, 639, 741, 742, 753, 652, 359/654; 250/201.1, 208.1; 257/294; 348/340
See application file for complete search history.

(56) References Cited

U.S. PATENT DOCUMENTS

| | | | |
|---|---|---|---|
| 4,689,291 A | 8/1987 | Popovic et al. | |
| 5,321,297 A | 6/1994 | Enomoto | |
| 5,605,783 A | 2/1997 | Revelli et al. | |
| 5,633,527 A * | 5/1997 | Lear | 257/432 |
| 5,670,384 A * | 9/1997 | Needham | 438/70 |
| 5,672,519 A | 9/1997 | Song et al. | |
| 5,677,200 A | 10/1997 | Park et al. | |
| 5,754,514 A | 5/1998 | Guerra | |
| 5,871,888 A | 2/1999 | Heremans et al. | |
| 5,910,940 A | 6/1999 | Guerra | |
| 6,171,883 B1 | 1/2001 | Fan et al. | |
| 6,301,051 B1 | 10/2001 | Sankur | |
| 6,307,243 B1 | 10/2001 | Rhodes | |
| 6,339,506 B1 | 1/2002 | Wakelin et al. | |
| 6,433,844 B2 | 8/2002 | Li | |
| 6,473,238 B1 | 10/2002 | Daniell | |
| 6,495,813 B1 | 12/2002 | Fan et al. | |
| 6,821,810 B1 | 11/2004 | Hsiao et al. | |
| 6,876,408 B2 * | 4/2005 | Yamaguchi | 349/57 |
| 2001/0033007 A1 | 10/2001 | Lee | |
| 2001/0050737 A1 | 12/2001 | Li | |

FOREIGN PATENT DOCUMENTS

| | | |
|---|---|---|
| EP | 1 045 449 A | 10/2000 |
| EP | 1 143 529 A2 | 10/2001 |
| JP | 07022599 A | 1/1995 |
| JP | 11008372 A | 1/1999 |
| KR | 2001-61341 | 7/2001 |
| WO | WO 95/08192 A | 3/1995 |

OTHER PUBLICATIONS

Tannas, Jr., Lawrence E., "Display Technologies and Applications," Society for Information Display, Applications Seminars, May 16-18, 2000, Long Beach, California.
Office Action dated Jan. 2008, issued in related Singapore Application No. 200506946-3.

* cited by examiner

*Primary Examiner* — Nelson D. Hernández Hernández
(74) *Attorney, Agent, or Firm* — Dickstein Shapiro LLP

(57) ABSTRACT

An imager or display system with multiple lenses, which are formed, patterned and shaped over one or more pixels in an imager or display array. The multiple lenses provide for an improved concentration of light being refracted onto a photosensitive area or light diffused from a display pixel.

23 Claims, 9 Drawing Sheets

Top View

Top View

FIG. 5 Top View
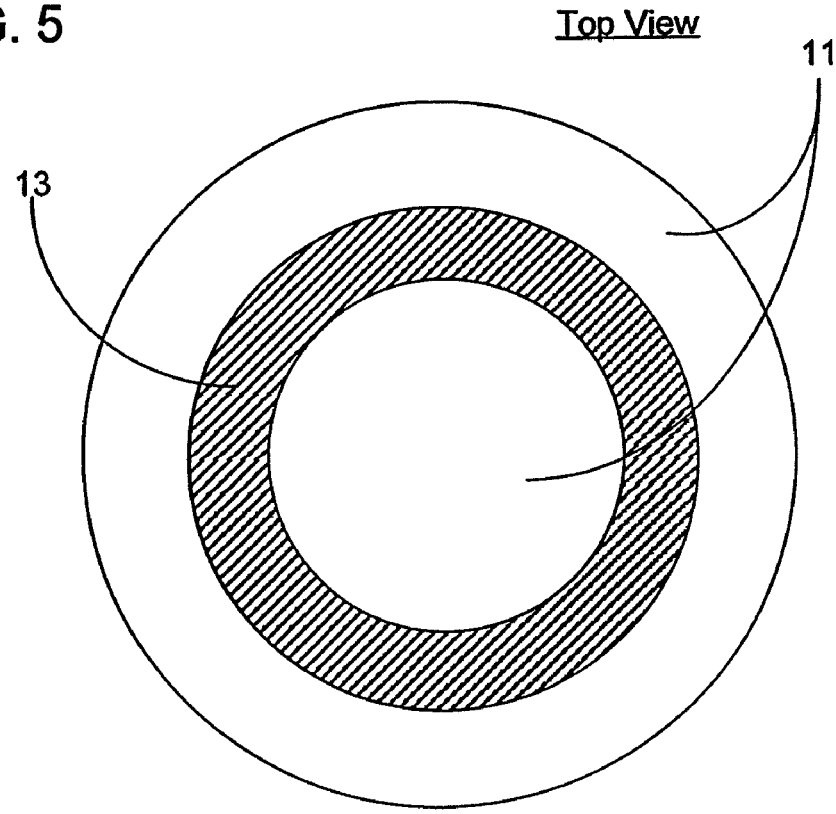
FIG. 6
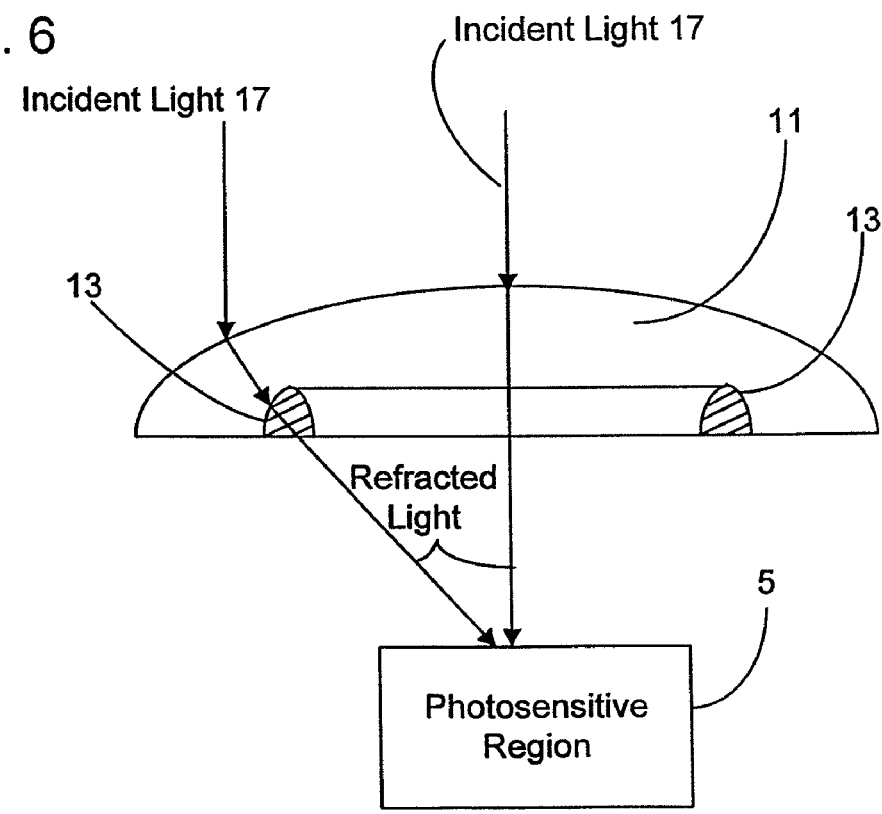

MULTIPLE MICROLENS SYSTEM FOR IMAGE SENSORS OR DISPLAY

CROSS-REFERENCE TO RELATED APPLICATION

This application is a continuation application of U.S. patent application Ser. No. 10/431,379, filed May 8, 2003, now abandoned the disclosure of which is incorporated herein in its entirety.

FIELD OF THE INVENTION

The present invention relates generally to improved semiconductor imaging devices, and in particular to a multiple microlens system for an imager array or display unit.

BACKGROUND OF THE INVENTION

Solid state imagers, including charge coupled devices (CCD) and CMOS sensors, have been commonly used in photo imaging applications. A solid state imager circuit includes a focal plane array of pixel cells, each one of the cells including either a photogate, photoconductor or a photodiode overlying a doped region of a substrate for accumulating photo-generated charge in the underlying portion of the substrate. Microlenses are commonly placed over imager pixel cells. A microlens is used to focus light onto the initial charge accumulation region. Conventional technology uses a single microlens with a polymer coating, which is patterned into squares or circles provided respectively over the pixels which are then heated during manufacturing to shape and cure the microlens.

Use of microlenses significantly improves the photosensitivity of the imaging device by collecting light from a large light collecting area and focusing it on a small photosensitive area of the sensor. The ratio of the overall light collecting area to the photosensitive area of the sensor is known as the pixel's fill factor.

Microlenses are formed on planarized regions, which are above the photosensitive area. After passing through the planarization regions, the light is filtered by color filters. Each conventional pixel can have a separate color filter. Alternatively, a pixel's filter regions will be varied by depth in order to filter out undesirable wavelengths.

As the size of imager arrays and photosensitive regions of pixels decreases, it becomes increasingly difficult to provide a microlens capable of focusing incident light rays onto the photosensitive regions. This problem is due in part to the increased difficulty in constructing a smaller micro lens that has the optimal focal length for the imager device process and that optimally adjusts for optical aberrations introduced as the light passes through the various device layers. Also, it is difficult to correct the distortion created by multiple regions above the photosensitive area, which results in increased crosstalk between adjacent pixels. "Crosstalk" results when off-axis light strikes a microlens at an obtuse angle. The off-axis light passes through planarization regions and a color filter, misses the intended photosensitive region and instead strikes an adjacent light sensitive region. Consequently, smaller imagers with untuned or nonoptimized microlenses do not achieve optimal color fidelity and signal/noise ratios.

Lens structures used with display systems also suffer from a lack of efficient lens systems. For example, active matrix liquid crystal display (LCD) systems have a cross polarizer than can open or block a light path with a voltage signal. The LCD assumes a parallel or perpendicular state to the polarizer angles in question. Light comes through a color filter to be viewed by a user when the light path is open. Current systems do not provide for good viewing angles in both X and Y directions without expensive or complex structures that are needed to disperse the light to provide a good viewing angle.

BRIEF SUMMARY OF THE INVENTION

The present invention provides a microlens structure for a pixel array in which the microlens associated with pixel(s) of the array includes a plurality of lens regions, each region having a different optical property. The optical properties of the plurality of lens regions are such that an increased amount of incident light reaches a light detector pixel or is dispersed from a display pixel.

Various exemplary embodiments and methods of their manufacture are discussed in detail below. These and other features of the invention are described in more detail below in connection with the accompanying drawings.

BRIEF DESCRIPTION OF THE DRAWINGS

FIG. 5 shows a top view of a microlens constructed in accordance with an exemplary embodiment of the invention;

FIG. 6 shows a cross sectional view of the FIG. 5 microlens;

DETAILED DESCRIPTION OF THE INVENTION

The invention provides a new microlens structure for use with optical detectors or display systems. The invention increases the amount of incident light reaching a photosensitive region of a pixel in an imager array. The invention can also be used to diffuse light from a display unit more efficiently. The microlens structure includes a plurality of lens regions having different optical properties to refract or divert light incident to a microlens either to a photosensitive region of a pixel or from a display structure in a more efficient manner.

Figure 1:
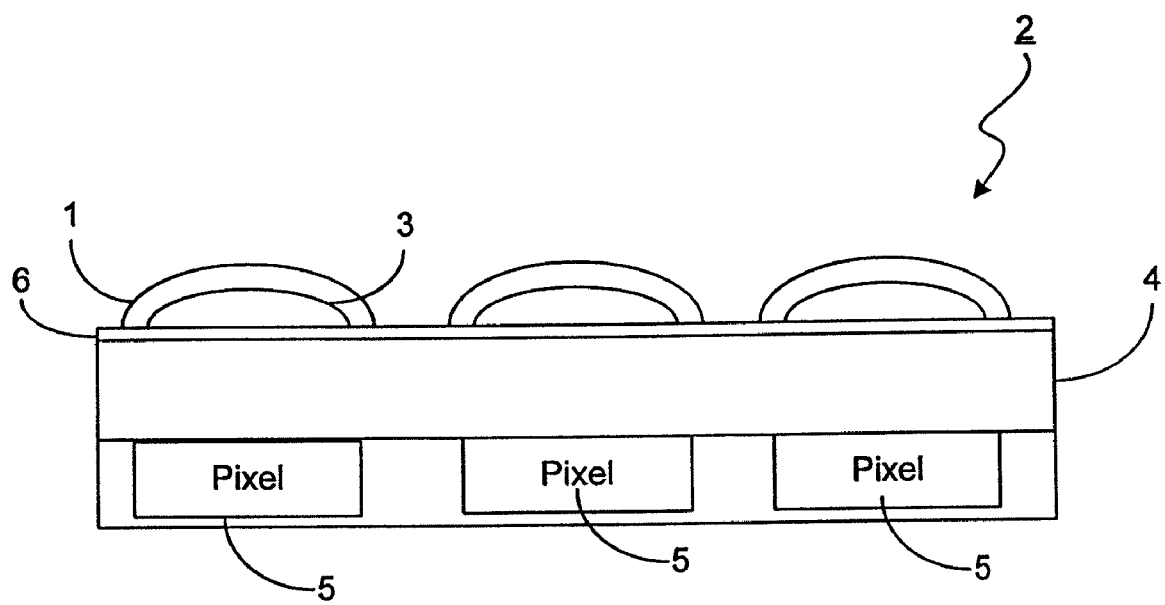
FIG. 1 shows a cross sectional view of a portion of a microlens structure constructed in accordance with an exemplary embodiment of the invention.
Figure 1A:
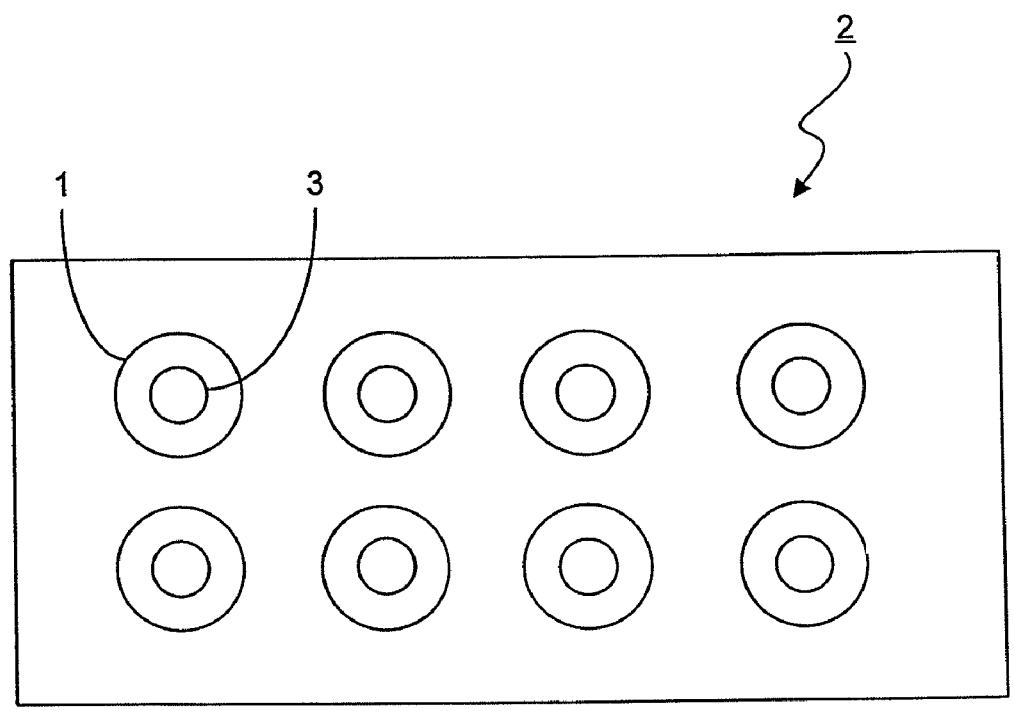
FIG. 1A shows a top view of a portion of the FIG. 1 embodiment.

Referring to FIGS. 1 and 1A, a first exemplary embodiment of an imager array 2 constructed in accordance with the invention is shown in cross sectional and top view, respectively. A plurality of microlens structures is provided, each having an upper lens portion 1 and a lower lens portion 3. The structures are provided over passivation region 6, intervening region 4 (e.g., color filter array, metallization region, etc) and an array of imaging pixels 5. Each pixel 5 has a photosensor for converting photons to electrical charges. The light collection efficiency of each pixel 5 is increased by creating two or more lens layers 1, 3 in each microlens to focus light more directly onto a light sensitive region of pixel 5. The lens layers 1, 3 can be formed into various symmetrical geometric shapes, such as circles, squares, etc., and asymmetrical shapes to provide a path for incident light rays to reach the photo sensitive regions of the pixel 5. FIG. 1A shows the lens regions 1, 3 as circular and noncontiguous with other lens structures with lens regions 1, 3; however, it should be understood that a variety of shapes may be used with the invention, as is further discussed below.

Figure 2:
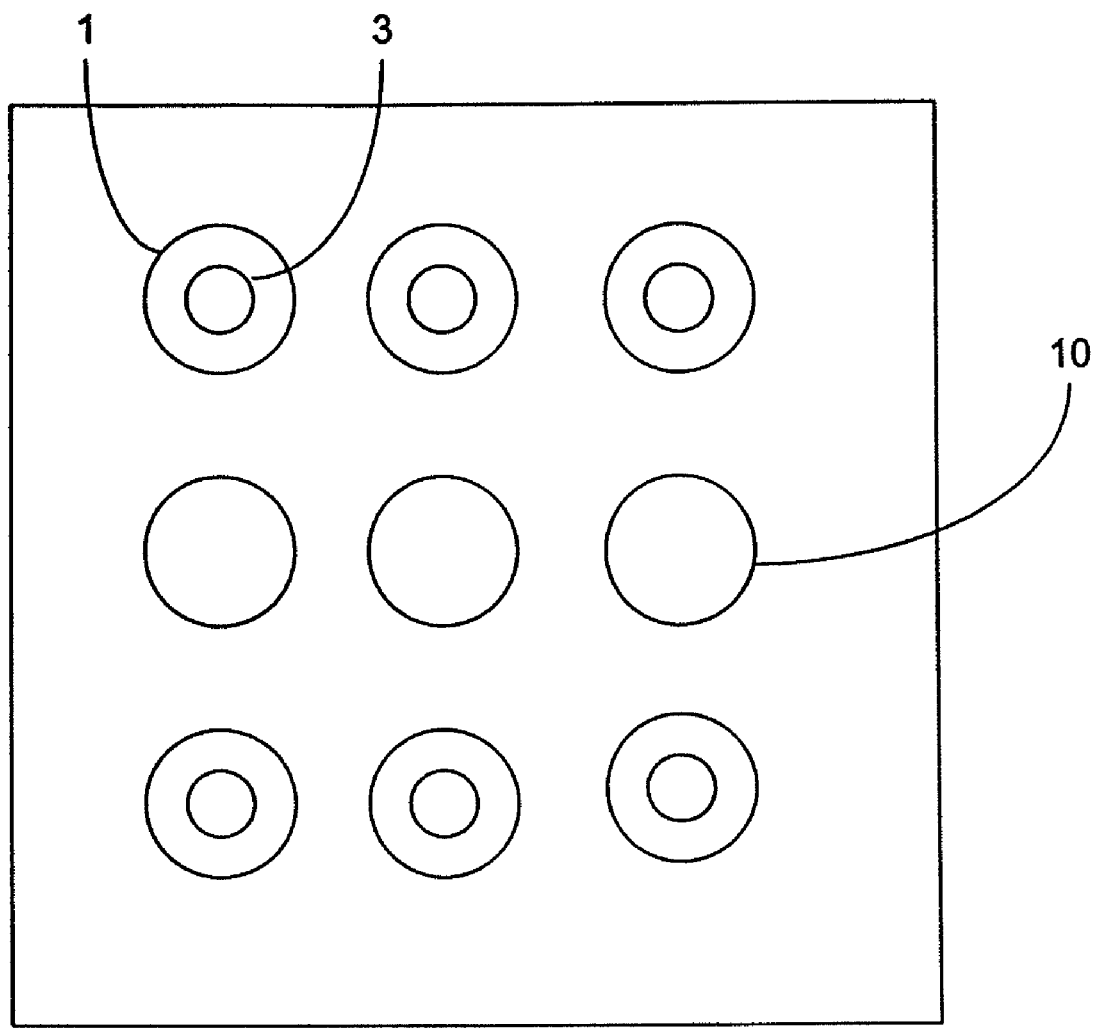
FIG. 2 shows a top view of a portion of another exemplary embodiment of a pixel array constructed in accordance with another aspect of the invention.

FIG. 2 shows a top view of a second embodiment of the invention in which a microlens array has a first group of microlenses each having two lens regions 1, 3 and a second group of microlenses each having a single lens 10. FIG. 2 illustrates that a microlens array can have different microlens structures respectively associated with different pixels of a pixel array.

The construction of each microlens structure is based upon the determination of desired combined refractive effects of the two or more lens regions 1, 3. A desired combined refractive effect is produced by the combined optical properties of regions 1, 3 which improves the fill factor for a pixel 5.

Refraction behavior of light that passes through boundary areas of two mediums is described in Snells equation:

$$N_1 * \sin \theta_1 = N_2 * \sin \theta_2 \quad (1)$$

which governs simple geometric optics. Refraction is the bending of the path of a light wave as it passes across the boundary separating two media. The angle at which a light wave encounters a boundary is referred to as the angle of incidence ($\theta_1$). The angle at which the light wave moves in relation to the media boundary after passage is referred to as the angle of refraction ($\theta_2$). $N_1$ and $N_2$ refer to the index of refraction associated with two materials that form a boundary between them, which a light wave passes through. Refraction is caused by the change in speed experienced by a light wave when the medium it passes through changes.

Figure 3:
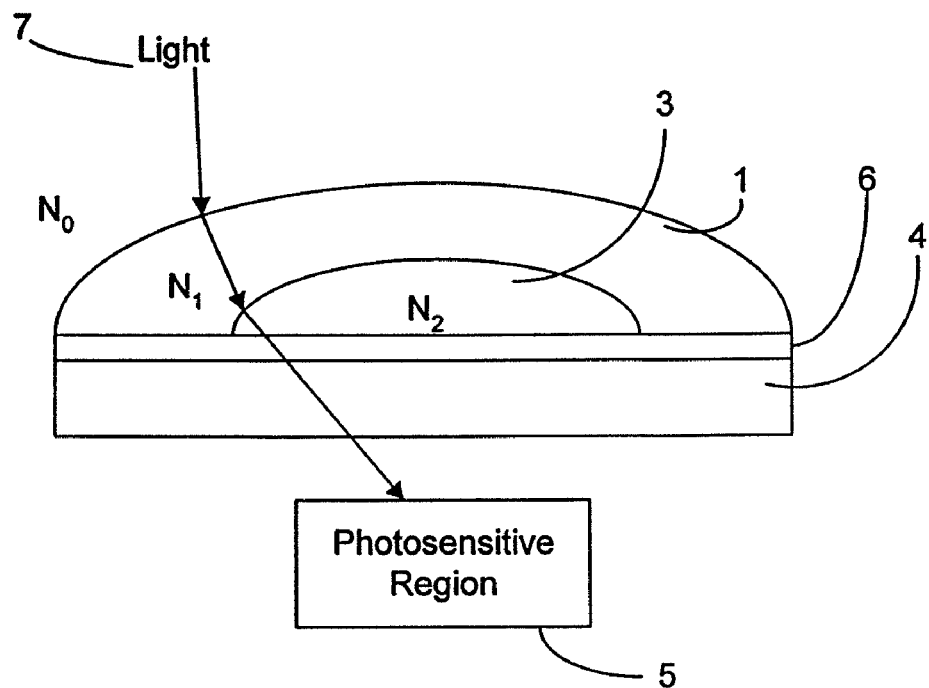
FIG. 3 shows a cross sectional view of an exemplary embodiment of the FIG. 1 microlens.

Referring to FIG. 3, the relationship $N_1 > N_2 > N_0$ is an example of a set of refractive indexes for a microlens having two different regions 1, 3. Regions 1, 3 have dimensions and refractive indexes selected to steer more light into a detector region than would otherwise occur using a single microlens or other conventional microlens structures. $N_1$ is the refractive index of the first lens region 1. $N_2$ is the refractive index of the second lens region 3 and $N_0$ is the refractive index of a medium outside the first lens region 1, such as air or other gasses.

FIG. 3 illustrates an expanded view of the FIG. 1 embodiment. The light collection efficiency of each pixel 5 is increased by creating more than one lens region 1, 3 in each microlens to focus light more directly on a photosensitive region of pixel 5. Lens region materials 1, 3 are positioned to steer, or direct, incident light 7 to an underlying photosensitive region 5. Lens regions 1, 3 can be formed into various symmetrical geometric shapes, such as circles, squares, etc. as well as asymmetrical shapes to provide a path for incident light rays to reach the photosensitive region of pixel 5.

Figure 4:
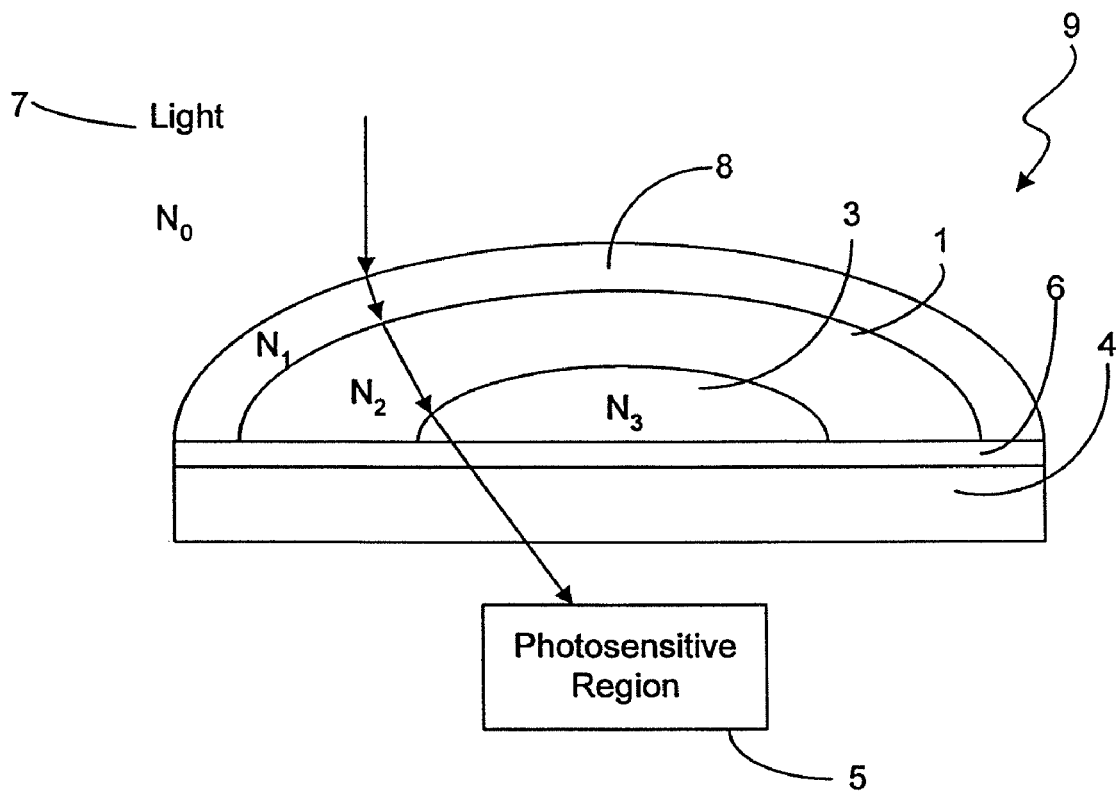
FIG. 4 shows a cross sectional view of another exemplary embodiment of a microlens constructed in accordance with another embodiment of the invention.

A third embodiment of the invention includes a microlens having more than two lens regions to better selectively adjust the refraction of light onto a photosensitive region. FIG. 4 shows microlens 9 having a first lens region 8 formed over a second lens region 1 which is in turn formed over a third lens region 3. The lens regions are formed with different refractive indexes of $N_3$, $N_2$ and $N_1$. The regions refractive indexes and lens sizes and shapes are selected to provide, in combination with other intervening layer refractive properties, a desired fill factor for photosensitive regions of the pixel 5 below the exemplary microlens 9. The refractive indexes and shape selections for each lens' regions 8, 1, 3 may also be chosen based on the optical properties of the underlying regions, e.g., planarization layer 6 or other layers 4, which may also affect the fill factor. In the embodiment depicted in FIG. 4, incident light is refracted by the multiple regions 8, 1, 3 so that a desired portion of the light is directed onto the photosensitive region 5. A topmost one of the lens regions, e.g., 8, may be formed as segmented lens regions or a single lens region 8 over the entire pixel array. The microlens 9 may be formed over each of the pixels in an imager array or a portion of the pixels in the array.

FIGS. 5 and 6 respectively illustrate a top view and cross sectional view of a fourth exemplary embodiment of the invention. In this embodiment, a lower lens ring 13 deflects light from an outer peripheral portion of a lens region 11 towards a photosensitive region of a pixel 5. The lens region 13 refracts only a portion of the light refracted by lens region 11 in order to selectively adjust the fill factor for a particular photosensitive region 5. One or more additional lens regions may be provided above lens region 11 to further direct light towards the photosensitive region of pixel 5. In this exemplary embodiment, a curved microlens region 11 is formed above another microlens region 13. However, the two microlens regions 11, 13 can be reversed; in which case, lens region 13 will be formed on lens region 11 to selectively refract light towards the photosensitive region of pixel 5.

As shown in FIG. 6, light 17 entering lens region 11 is refracted into the lower lens region 13. Lens region 13 further refracts the light 17 near the peripheral edge at a sharp angle onto the photosensitive region of the pixel 5.

The refractive indexes of the plurality of lens regions can be chosen based upon consideration of the light refractive properties of the layers between the microlens region and photosensitive region to maximize light transmission to the photosensitive regions of a pixel 5. As mentioned above, a microlens array in accordance with the invention can include different microlens structures in different portions of the pixel array. Light which is incident on pixels at the center of a pixel array can be very different from light which is incident on pixels at the outer edges of the pixel array. Accordingly, one microlens structure can be provided over pixels in the middle of the array and another different microlens structure can be used for incident light transmission in other peripheral pixels of the array.

Figure 7:
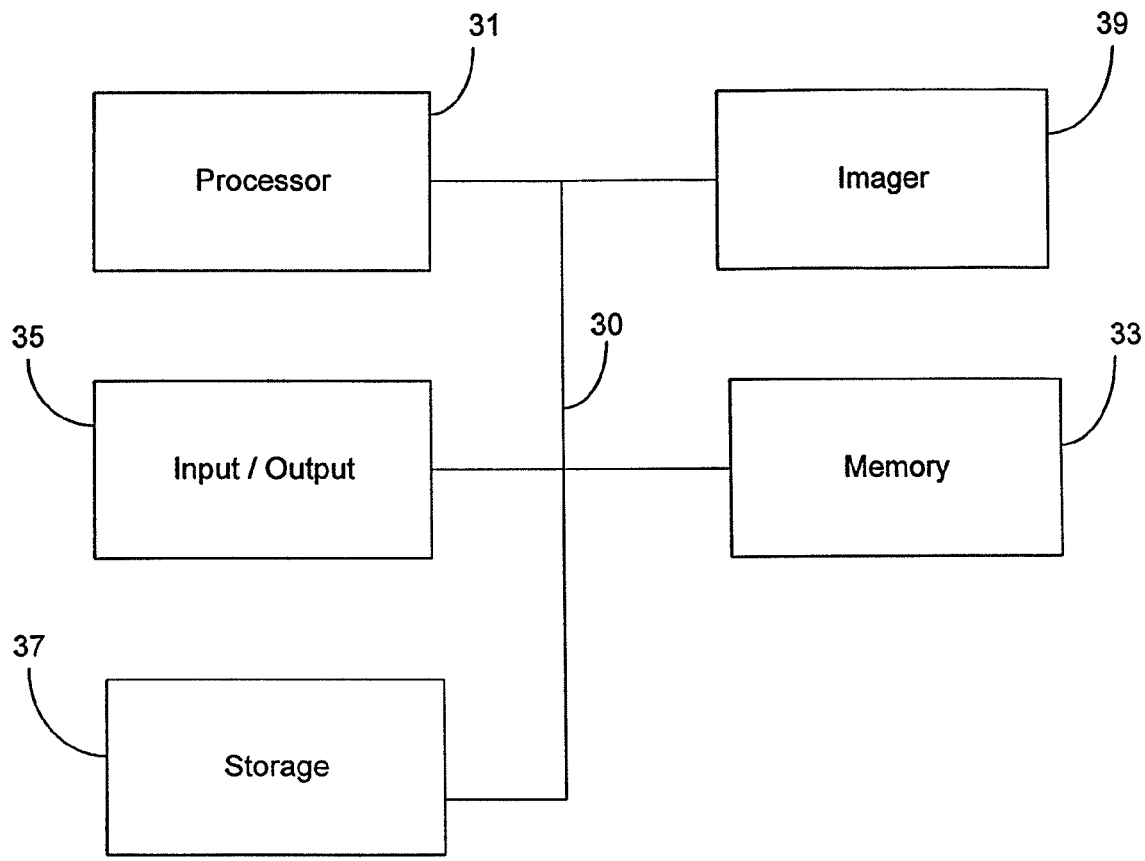
FIG. 7 shows a block diagram of an imager system constructed in accordance with an exemplary embodiment of the invention.

FIG. 7 shows an image processing system that incorporates a processor 31, memory 33, an input/output system 35, a storage unit 37 and an imager 39. A bus 30 couples the image processing system components. The imager 39 contains an array of pixels having an associated microlens structure in accordance with the invention.

Pixel arrays having a microlens constructed in accordance with the invention, and described with reference to examples in FIGS. 1-7, may be employed in a CMOS, CCD, or other imagers. The microlens structures of the invention may be used as a single microlens for a pixel or as an array of microlenses for respective pixels.

Figure 8:
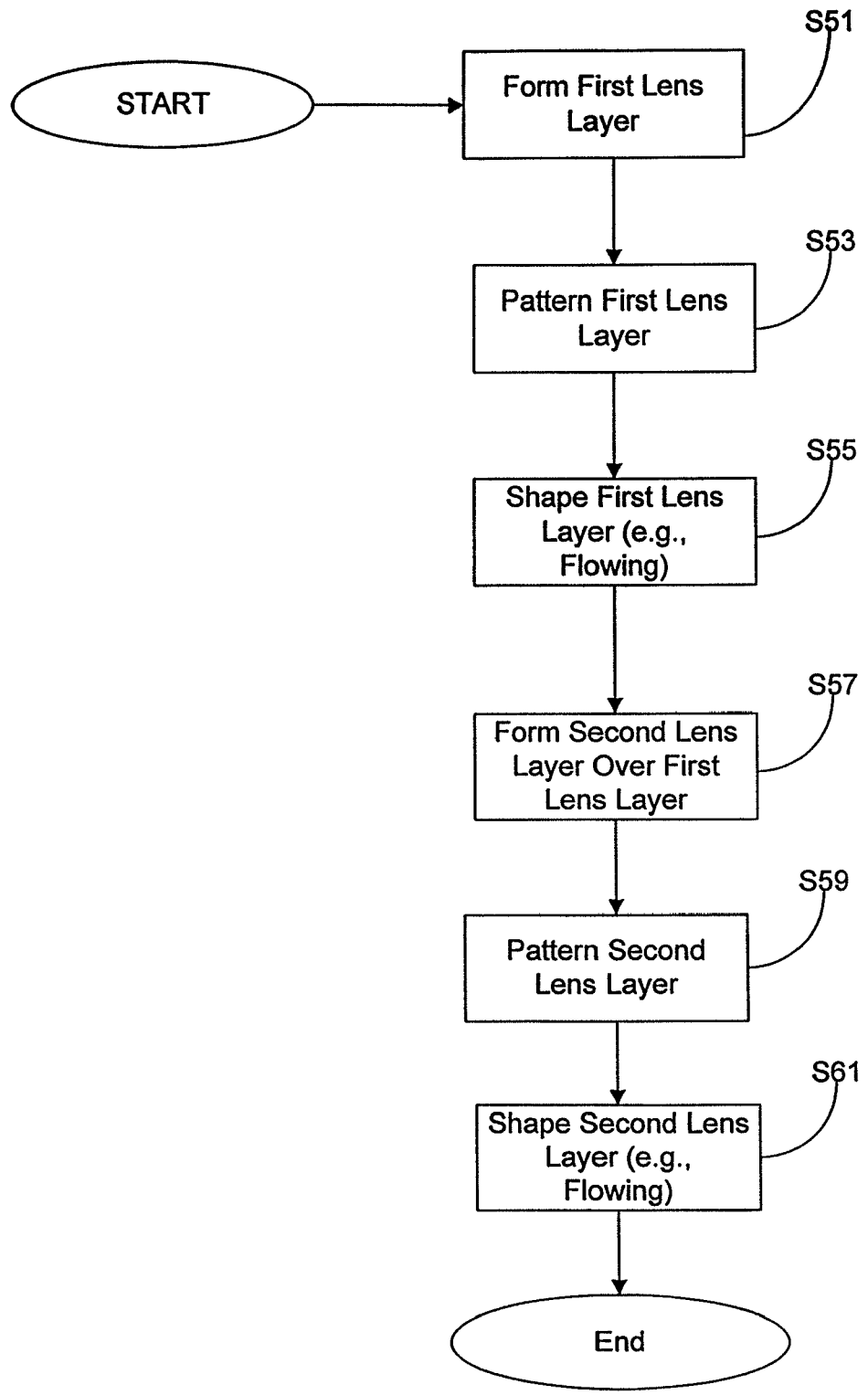
FIG. 8 shows a manufacturing method performed in accordance with an exemplary embodiment of the invention.

FIG. 8 shows one method of manufacturing the microlens structures illustrated in FIGS. 1, 1A and 3. The method utilizes a substrate, which contains a pixel array, peripheral circuits, contacts and wiring. One or more protective layers, e.g., BPSG, BSG, PSG, silicon dioxide or silicon nitride or other transparent material, are formed over the pixel array and planarized. A spacing layer may be formed over the protective layers. Construction of the microlens structure then begins. At S51, a first lens region, e.g., region 3 (FIG. 3), is formed with a material and thickness that will, in combination with other lens regions, increase incident light passing onto a photosensitive region of pixel 5. The first lens region 3 may be applied using a process such as spin coating and be formed of a transparent or polymeric material. Other lens forming materials may also be used including optical thermoplastic such as polymethylmethacrylate, polycarbonate, polyolefin, cellulose acetate butyrate, or polystyrene, a polymide, a thermoset resin such as an epoxy resin, a photosensitive gelatin or a radiation curable resin such as acrylate, methacrylate, urethane acrylate, epoxy acrylate, or polyester acrylate.

At S53, the first lens region is patterned to form individual microlens region 3. Patterning can be accomplished using standard photolithography equipment and techniques. At S55, individualized microlens region 3 is shaped into a desired configuration, such as asymmetric circular, by lens processing such as baking. At S57, the first lens region 3 is overcoated with a second lens region 1 and formed with a material and to a thickness which, in combination with other lens regions through which incident light travels, increases fill factor, or intensity of incident light, for photosensitive region of pixel 5. At S59, the second region 1 is patterned. Next, second lens region 1 is shaped (e.g., flowed) by baking at S61.

Figure 9:
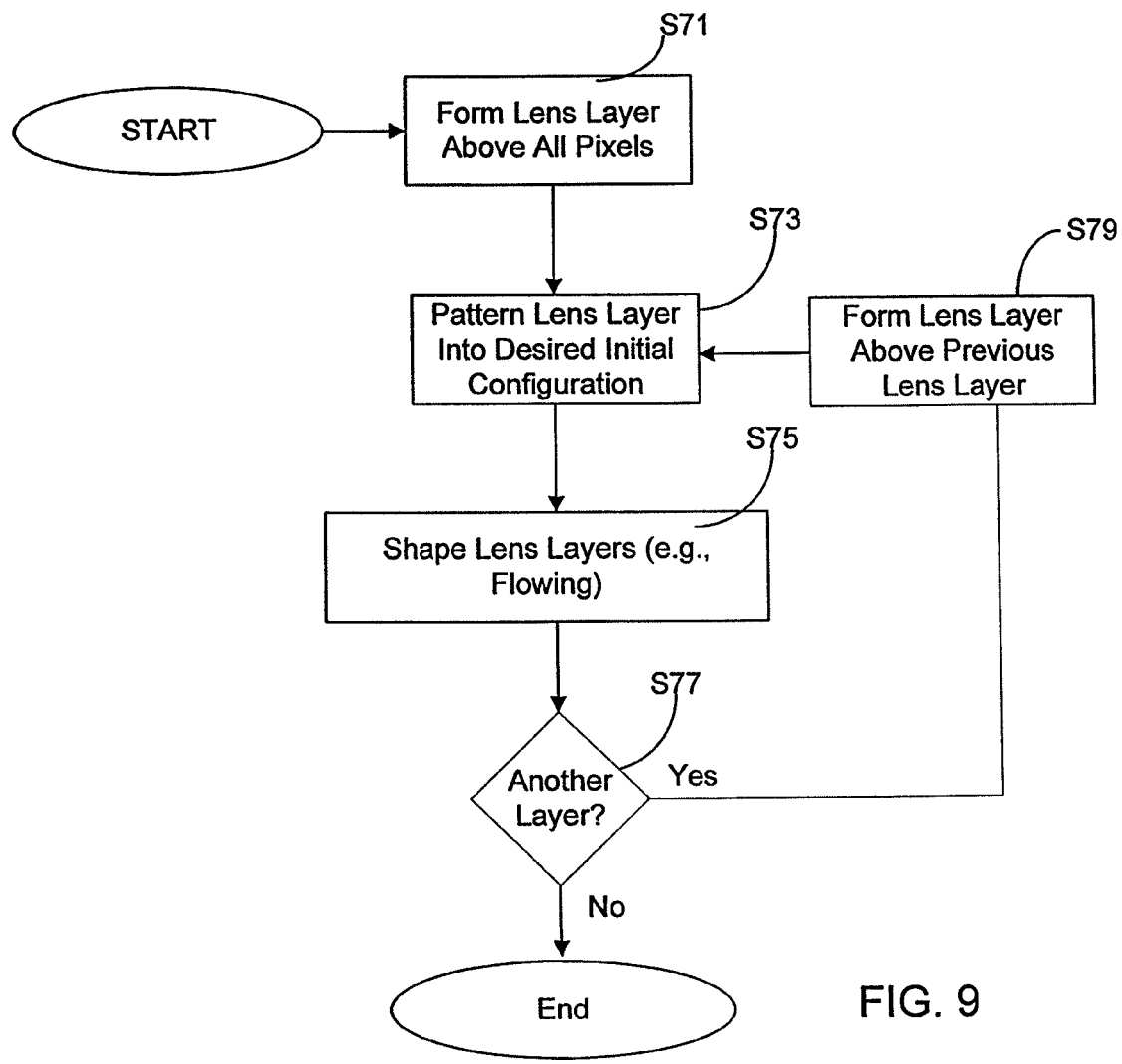
FIG. 9 shows a manufacturing method performed in accordance with another exemplary embodiment of the invention.

FIG. 9 shows an exemplary manufacturing method for forming the microlens structures of FIG. 4. Initially, at S71, a lens region 3 is formed over pixels of the pixel array. At S73, lens region 3 is patterned to produce individually shaped microlens region 3. Region 3 may be patterned into circular, rectangular or other shapes at processing segment S73. At S75, patterned lens region 3 is shaped into a light focusing lens configuration by baking. If desired, another lens region, e.g., 1 (FIG. 4), is formed above the previous lens region 3 at processing segment S79. Processing segments S73, S75 are repeated for each new applied layer. At S77, a determination is made on whether or not to apply another lens region. If another lens region is not to be applied, processing terminates. If another lens region is to be formed, processing segments S79, S73 and S75 are repeated.

Figure 10:
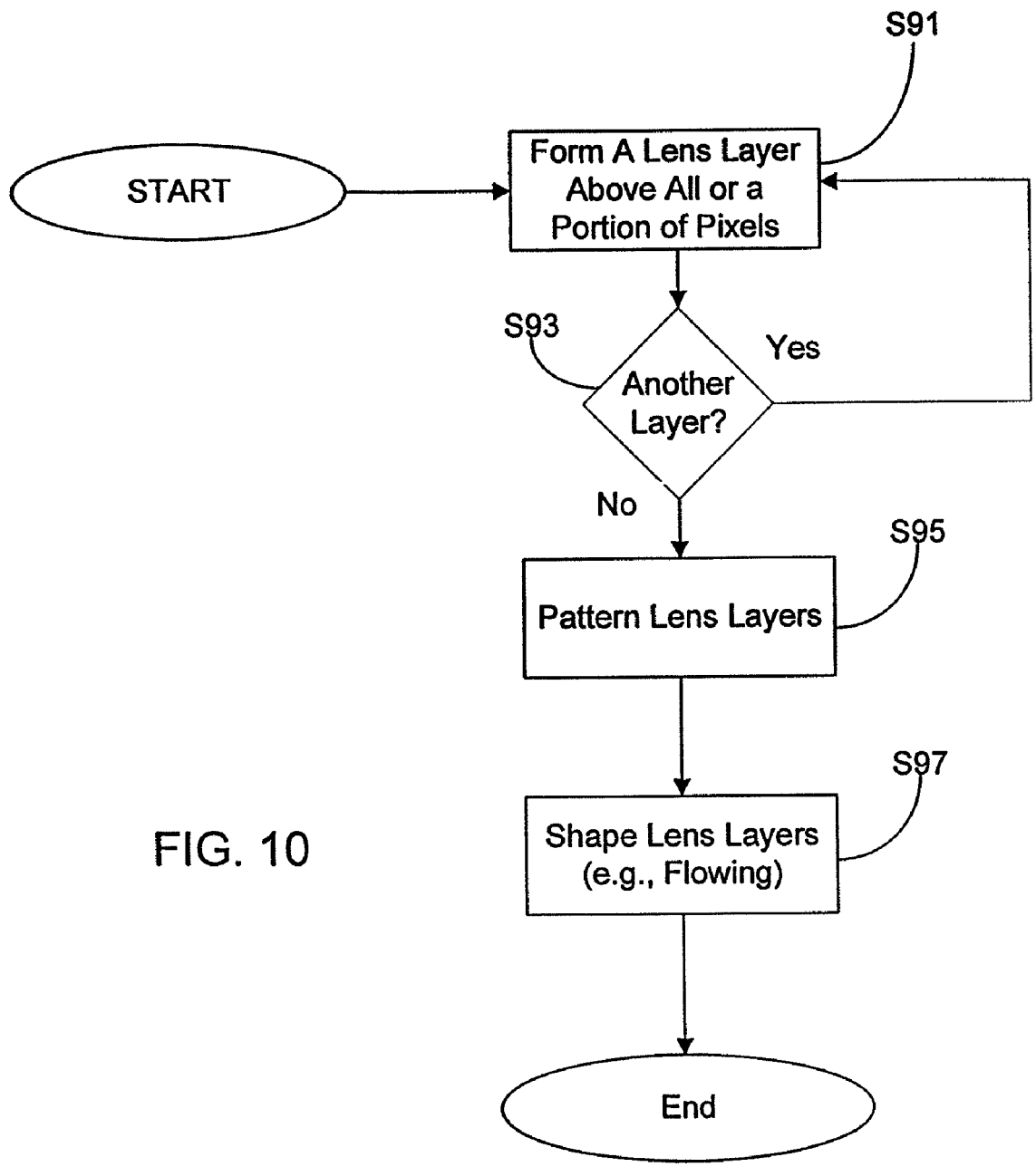
FIG. 10 shows a manufacturing method performed in accordance with another exemplary embodiment of the invention.

FIG. 10 shows another exemplary manufacturing method for forming an exemplary microlens array containing multiple lens regions in accordance with the invention. All microlens layers are formed over pixels 5 at steps S91-S93. The layers are patterned at S95 and shaped at S97.

At S97 the lens regions (e.g., 1, 3) are collectively shaped by means such as flowing the lens regions by baking. Steps S91-S97 are performed such that the resulting multiple lens regions in an exemplary microlens provides for maximized light refraction to respective photosensitive regions (e.g., 5).

The shape of the patterned individualized microlenses may be circular, lenticular, ovoid, rectangular, hexagonal or any other suitable shape. Shaping of lens regions can be accomplished by heat treatment to form refractive lens regions from the applied and patterned lens forming regions. The shaping process used to form the refractive lens regions depends on the material used to form the lens regions. If the material of the lens forming regions may be heat treated, then heat treatment processes such as baking may be used. If the material is extremely photosensitive, then special light exposure techniques may be used.

The invention can also be used with light projection systems as well as light detection systems. The same principles apply if the light is coming out of the substrate as when the light is going in. While the structural parameters might change for optimal performance with display systems as compared with imager systems, the invention still provides an improved structure for light distribution.

Figure 11:
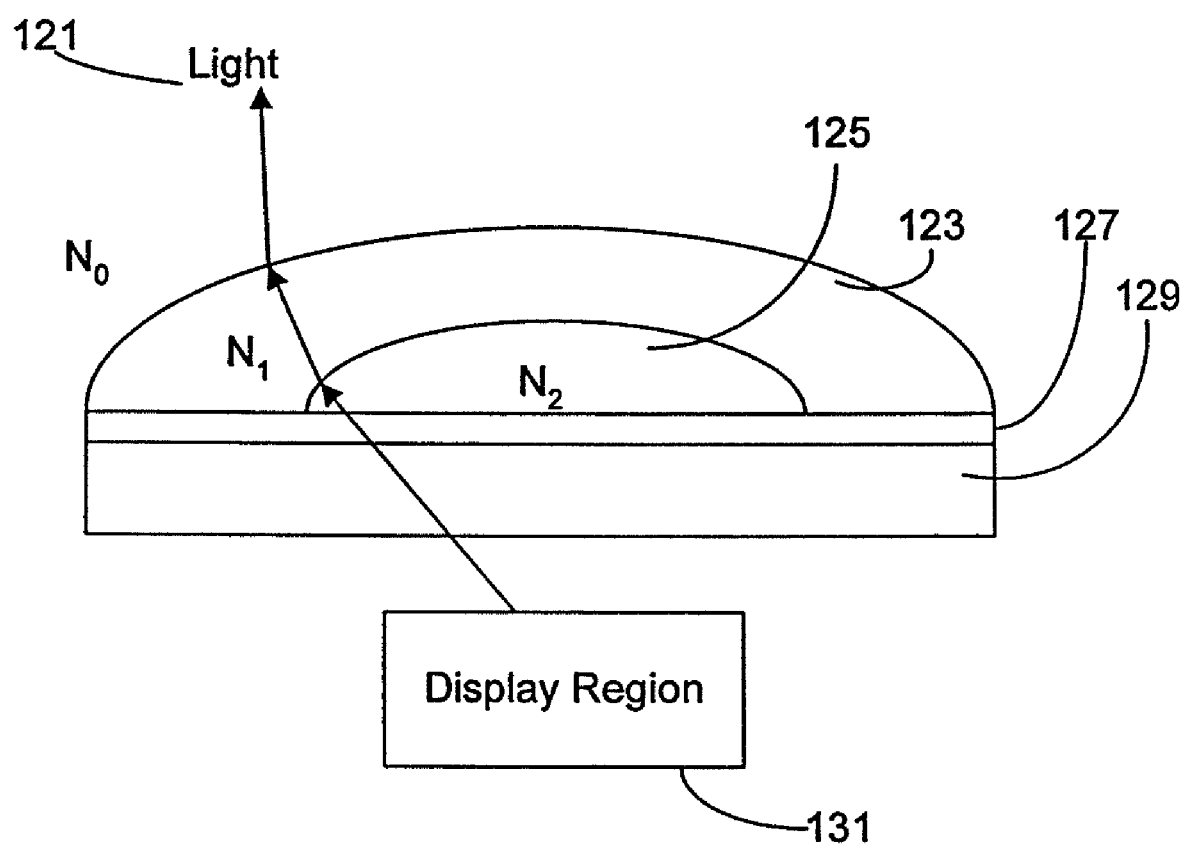
FIG. 11 shows a cross sectional view of a lens constructed in accordance with another exemplary embodiment of the invention.

Referring to FIG. 11, a lens structure is formed over a display region 131. The display region 131 can be a display pixel or a light emitting unit. Multiple lens structures can be formed over the same display region 131 in a lens ensemble in order to further increase light dispersion and improve viewing angle from display region 131. Light is emitted from display region 131 and enters a layer 129, which can be a top glass or other display layer (e.g., top glass layer in a LCD system) and then the light enters polarizer 127 and is refracted according to polarizer operation. Light then enters the first lens region 125 with refractive index $N_2$ where light is refracted into second lens region 123 having a refractive index $N_1$. The light is then further refracted by the second lens region 123 into air where it is refracted again. The display lens structure of FIG. 11 incorporates regions 123 and 125 are formed in the same manner and of the same material as the corresponding lens regions in other embodiments of the invention.

It should again be noted that although the invention has been described with specific reference to imaging circuits having a pixel array, the invention has broader applicability and may be used in any imaging apparatus as well as in display devices. Similarly, the process described above is but one method of many that could be used to form lenses in accordance with the invention. The above description and drawings illustrate exemplary embodiments in accordance with the invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A lens system comprising:
   a lower lens region having a ring shape and a first refractive index, the lower lens region having a bottom surface, a first curved sidewall facing the interior of the lower lens region and a second curved sidewall facing the exterior of the lower lens region, the two curved sidewalls extending from the bottom surface; and
   an upper lens region having a second refractive index, the upper lens region being formed above and in direct contact with the lower lens region including the two curved sidewalls of the lower lens region.

2. The lens system of claim 1, wherein the upper and lower first and second lens regions are formed of respective first and second materials.

3. The lens system of claim 1, wherein the first refractive index is greater than the second refractive index.

4. The lens system of claim 1, further comprising another lens region formed above the upper lens region.

5. The lens system of claim 1, wherein the upper lens region extends around a periphery of the lower lens region.

6. The lens system of claim 1, wherein the lens system is formed above a display region.

7. The lens system of claim 6, wherein the display region is a display pixel.

8. The lens system of claim 1, wherein the first and second refractive indexes are different.

9. The lens system of claim 1, wherein the lower lens region deflects light from an outer peripheral portion of the upper lens region towards a photosensitive region of a pixel.

10. The lens system of claim 1, wherein the entirety of the lower lens region is within the upper lens region.

11. A light projecting system comprising:
a light source; and
a lens structure for focusing light from the light source, comprising:
a lower lens region having a ring shape and a first refractive index, the lower lens region having at least three surfaces including a bottom surface, a first curved sidewall facing the interior of the lower lens region and a second curved sidewall facing the exterior of the lower lens region, the two curved sidewalls extending from the bottom surface; and
an upper lens region having a second refractive index, the upper lens region being formed above and in direct contact with the lower lens region including the two curved sidewalls of the lower lens region.

12. The light projecting system of claim 11, wherein the light source is a light-emitting diode.

13. The light projecting system of claim 11, wherein a refractive index of the upper lens region is greater than a refractive index of the lower lens region.

14. The light projecting system of claim 11, further comprising another lens region formed above the upper lens region.

15. The light projecting system of claim 11, wherein the lower lens region deflects light from an outer peripheral portion of the upper lens region towards a photosensitive region.

16. The light projecting system of claim 11, wherein the entirety of the lower lens region is within the upper lens region.

17. A method of forming a lens structure, said method comprising:
forming a lower light condensing region having a ring shape and a first refractive index, the lower lens region having at least three surfaces including a bottom surface, a first curved sidewall facing the interior of the lower lens region and a second curved sidewall facing the exterior of the lower lens region, the two curved sidewalls extending from the bottom surface; and
forming an upper light condensing region having a second refractive index, the upper lens region being formed above and in direct contact with the lower lens region including the two curved sidewalls of the lower lens region.

18. The method of claim 17, further comprising forming another light condensing region above the upper light condensing region.

19. The method of claim 18, wherein at least one of the forming steps includes heat treatment.

20. The method of claim 18, wherein at least one of the forming steps includes baking.

21. The method of claim 17, wherein the first refractive index is greater than the second refractive index.

22. The method of claim 17, further comprising a step of forming a display region in direct contact with the lower light condensing region where the formed lower light condensing region is formed above the formed display region.

23. A lens system comprising:
a lower lens region having a ring shape and a first refractive index, the lower lens region having a first curved sidewall facing the interior of the lower lens region and a second curved sidewall facing the exterior of the lower lens region, the two curved sidewalls extending from a bottom surface; and
an upper lens region having a second refractive index, the upper lens region being formed to completely surround and directly contact the lower lens region including the two curved sidewalls of the lower lens region,
wherein the first refractive index is greater than the second refractive index such that the lower lens region deflects light from an outer peripheral portion of the upper lens region towards a photosensitive region.

* * * * *

UNITED STATES PATENT AND TRADEMARK OFFICE
CERTIFICATE OF CORRECTION

PATENT NO. : 7,916,204 B2  
APPLICATION NO. : 12/628709  
DATED : March 29, 2011  
INVENTOR(S) : David Wells et al.

It is certified that error appears in the above-identified patent and that said Letters Patent is hereby corrected as shown below:

On the Title Page, Item (54), and Col. 1, line 2, in "Title", after "DISPLAY" insert -- UNITS --.

On the Title Page, Item (73), in "Assignee", line 1, delete "Bosie," and insert -- Boise, --, therefor.

In column 1, line 2, after "DISPLAY" insert -- UNITS --.

Signed and Sealed this  
Thirty-first Day of May, 2011

David J. Kappos  
*Director of the United States Patent and Trademark Office*